United States Patent
Kawamura

(10) Patent No.: US 8,106,342 B2
(45) Date of Patent: Jan. 31, 2012

(54) SOLID-STATE IMAGE CAPTURING DEVICE AND ELECTRONIC INFORMATION DEVICE

(75) Inventor: Tomohiko Kawamura, Hiroshima (JP)

(73) Assignee: Sharp Kabushiki Kaisha, Osaka (JP)

( * ) Notice: Subject to any disclaimer, the term of this patent is extended or adjusted under 35 U.S.C. 154(b) by 748 days.

(21) Appl. No.: 12/230,656

(22) Filed: Sep. 3, 2008

(65) Prior Publication Data

US 2009/0078856 A1  Mar. 26, 2009

(30) Foreign Application Priority Data

Sep. 5, 2007  (JP) ................................. 2007-230806

(51) Int. Cl.
*H04N 3/14*  (2006.01)
*H04N 5/335* (2011.01)
*H01J 40/14*  (2006.01)
*H01L 27/14*  (2006.01)

(52) U.S. Cl. ...................... 250/208.1; 257/231; 257/443; 257/E27.131

(58) Field of Classification Search ................ 250/208.1; 257/231, 233, 443, 448, 459, E27.131, E27.133, 257/E27.152; 348/281, 302
See application file for complete search history.

(56) References Cited

U.S. PATENT DOCUMENTS

| | | | | |
|---|---|---|---|---|
| 7,420,231 B2 * | 9/2008 | Maruyama | ..................... | 257/233 |
| 7,550,792 B2 * | 6/2009 | Ogawa et al. | .................. | 257/233 |
| 7,705,375 B2 * | 4/2010 | Nishijima et al. | ............ | 257/233 |
| 2004/0100570 A1 * | 5/2004 | Shizukuishi | .................. | 348/272 |
| 2007/0182837 A1 * | 8/2007 | Nishijima et al. | ............ | 348/275 |
| 2007/0273779 A1 * | 11/2007 | Abe et al. | ...................... | 348/294 |
| 2008/0210984 A1 * | 9/2008 | Kawamura | ..................... | 257/231 |
| 2008/0210985 A1 * | 9/2008 | Ogawa et al. | .................. | 257/233 |
| 2009/0078856 A1 * | 3/2009 | Kawamura | ................ | 250/214 R |
| 2009/0136174 A1 * | 5/2009 | Itahashi | .......................... | 385/14 |

FOREIGN PATENT DOCUMENTS

| | | | |
|---|---|---|---|
| JP | 04162476 A | * | 6/1992 |
| JP | 11097662 A | * | 4/1999 |
| JP | 2000-252452 | | 9/2000 |
| JP | 2006-093263 | | 4/2006 |
| JP | 2006-222427 | | 8/2006 |
| JP | 2007-019521 | | 1/2007 |
| JP | 2007-157912 | | 6/2007 |
| JP | 2007-214272 | | 8/2007 |

OTHER PUBLICATIONS

Japanese Office Action dated Jan. 25, 2010, issued in Japanese Patent Application No. 2007-230806.

* cited by examiner

*Primary Examiner* — John Lee
(74) *Attorney, Agent, or Firm* — Edwards Wildman Palmer LLP; David G. Conlin; Stephen D. LeBarron

(57) ABSTRACT

A solid-state image capturing device includes a multilayer wiring layer to open regions above a plurality of respective light receiving sections for performing photoelectric conversion on incident light to generate a signal charge; a color filter of each color provided above the multilayer wiring layer in a corresponding manner to each light receiving section; and a microlens provided on the color filter of each color, for focusing the incident light at each light receiving section, wherein a wiring layer within one layer among the multilayer wiring layer limits an area of a light receiving region for incident light that enters the light receiving section, equally among the light receiving sections.

34 Claims, 6 Drawing Sheets

A : B = a : b

US 8,106,342 B2

SOLID-STATE IMAGE CAPTURING DEVICE AND ELECTRONIC INFORMATION DEVICE

This Nonprovisional application claims priority under 35 U.S.C. §119(a) on Patent Application No. 2007-230806 filed in Japan on Sep. 5, 2007, the entire contents of which are hereby incorporated by reference.

BACKGROUND OF THE INVENTION

1. Field of the Invention

The present invention relates to a solid-state image capturing device for performing photoelectric conversions on and capturing image light from a subject, which is composed of a semiconductor element, such as a MOS image sensor. Further, the present invention relates to an electronic information device, such as a digital camera (e.g., digital video camera and digital still camera), an image input camera, a scanner, a facsimile machine and a camera-equipped cell phone device, having the solid-state image capturing device as an image input device used in an image capturing section of the electronic information device.

2. Description of the Related Art

In recent years, a MOS image sensor using a MOS (Metal Oxide Semiconductor) has begun to be widely used as a conventional solid-state image capturing device, along with a CCD (Charge Coupled Device) image sensor. That is because the MOS image sensor can be downsized and its operation can be sped up by being integrated with a peripheral circuit for driving a sensor using a conventional IC manufacturing method. Further, that is because the MOS image sensor has an advantage of having a simpler structure and the MOS image sensor does not require a high driving voltage, compared to the CCD image sensor.

Unlike the CCD image sensor, the MOS image sensor reads out a signal charge from a photodiode, which functions as a photoelectric conversion section, by converting it into an image capturing signal. Therefore, for each pixel, a charge detection section (charge voltage conversion section; floating diffusion FD) and a plurality of transistors are used, the plurality of transistors constituting a signal readout circuit for amplifying a signal voltage according to the signal voltage detected by the charge detection section. For example, a MOS image sensor in general requires, for each pixel, four transistors, namely a charge transfer transistor, a reset transistor, an amplifying transistor, and a selection transistor, which constitute a signal readout circuit; a photodiode functioning as a light receiving element that constitutes a light receiving section; a charge detection section; and a signal readout circuit. As a result, it is difficult to miniaturize the pixel of the MOS image sensor.

Recently, a charge detection section (floating diffusion FD) and a signal readout circuit are shared by a plurality of light receiving section as a multiple pixel sharing structure, and circuit driving that does not require a selection transistor is conceived as a signal readout circuit. Further, it is conceived that the number of transistors per pixel is reduced to control the deterioration of characteristics for the miniaturization of pixels.

FIG. 8 is a top view schematically illustrating a conventional pixel arrangement of a two pixel sharing structure.

As illustrated in FIG. 8, a conventional MOS image sensor 100 has a two pixel sharing structure, in which a light receiving sections 101 and 102 are paired and arranged in a longitudinal direction. Gate electrodes 103 and 104, for respective charge transfer transistors are provided at the adjacent and opposing corner portions in the rectangular-shaped light receiving region of the light receiving sections 101 and 102. The gate electrode 103 is driven and a signal charge is transferred from the light receiving section 101 to a shared floating diffusion FD. In addition, the gate electrode 104 is driven and a signal charge is transferred from the light receiving section 102 to a shared floating diffusion FD. The signal charge is converted into a signal voltage by the floating diffusion FD. The converted signal voltage is amplified in accordance with the signal voltage by a signal readout circuit (not shown) to be output to a signal line as an image capturing signal. Above the light receiving sections 101 and 102, color filters (not shown) of respective colors are provided. When the color arrangement for such color filters is the Bayer arrangement, the colors of the color filters (not shown) correspond, for example, to "B (blue color)" for the light receiving section 101, "G (green color)" for the light receiving section 102, "R (red color)" for the light receiving section on the right of the light receiving section 102, and "G (green color)" for the light receiving section on the right of the light receiving section 101.

FIG. 9 is an enlarged top view schematically illustrating one pixel structure in the solid-state image capturing device in FIG. 8.

In FIG. 9, a method for selecting a pixel by X and Y addresses to read a signal charge, and for selecting a pixel through two, the upper and lower layers (first layer and second layer) of metal wiring layers is used in general in the conventional MOS image sensor 100. For example, in FIG. 9, the wiring in the Y direction (longitudinal direction) is illustrated as a first layer of a metal wiring layer 111, and the wiring in the X direction (transverse direction) is illustrated as a second layer of a metal wiring layer 112. The gate electrode 103, which constitutes the charge transfer transistor, is put across the lower right corner portion of the light receiving section 101. The signal charge is transferred from the light receiving section 101 to the floating diffusion FD through a channel region below the gate electrode 103 by applying a transfer control voltage to the gate electrode 103. Note that a third layer of a metal wiring layer 117, which will be described later, is not shown here.

FIG. 10 is a longitudinal cross sectional view of two pixels in the A-A' direction in FIG. 9.

In FIG. 10, a P-type well region 115 is formed on an N-type substrate 114. The light receiving section 101, which is composed of an N-type layer that constitutes a photodiode, and a P-type separation region 116 as pixel separation layers, which has a higher concentration than the P-type well region 115, are provided in the P-type well region 115. In addition, The first layer of the metal wiring layer 111, the second layer of the second wiring layer 112, and the third layer of the metal wiring layer 117 are provided in an interlayer insulation film 118, as wiring layers that connect each element for operating the light receiving section 101 functioning as a pixel to read out a signal. Further, a color filter for each color is provided above the pixel in a corresponding manner to the light receiving sections 101 and 102. A microlens 120 for focusing light on the respective light receiving sections 101 and 102 is provided on the color filter 119. Note that the second layer of the metal wiring layer 112 described above is not illustrated here.

In this case, the circumference of the light receiving section 101 and the gate electrode 103 at the lower right corner portion are limited by the two longitudinally oriented lines of the first layer of the metal wiring layer 111 and the two transversely oriented lines of the second layer of the metal wiring layer 112, such that incident light enters the light receiving section 101 and the gate electrode 103 in a plan view. Thus, the way to avoid covering the light receiving section 101 by the metal wiring layer is to reduce shielding the light receiving section as much as possible and maximize the opening above so as to secure the amount of incident light onto the light receiving section 101.

As a technique similar to the structure according to the present invention, Reference 1 is proposed, where a portion of a wiring layer surrounds above and avoid covering a photodiode such that incident light does not enter the peripheral section of the photodiode.

In Reference 1, a thick, multilayer wiring layer and an interlayer insulation film exist between a photodiode and a shielding film that is provided to avoid covering the photodiode. Even if a peripheral section of the photodiode is attempted to be shielded by the shielding film, the distance between the photodiode and the shielding film is long. Therefore, the incident light that enters, from an opening of the shielding film provided above the photodiode goes around and enters the peripheral section of the photodiode. This will result in a smear. In order to prevent such a smear, another solid-state image capturing device is proposed, where a portion of a wiring layer under a shielding film is positioned so that a light entering region is further reduced and limited. As a result, light will not enter a transistor in a peripheral section of the photodiode, and the opening of the shielding film is further narrowed to be shielded, thereby reducing a smear.

Reference 1: Japanese Laid-Open Publication No. 2000-252452

SUMMARY OF THE INVENTION

The conventional technique described above, however, has the following problems.

As illustrated in FIG. 8, the gate 103 is positioned at the lower right corner portion of the light receiving section 101, and the gate electrode 104 is positioned at the upper right portion of the light receiving section 102. Therefore, the directions of chipped portions are different according to the light receiving section 101 and the light receiving section 102. For example, when longitudinally-tilted oblique light L enters, the light is focused on the lower sides of the light receiving sections 101 and 102, and the amount of light received is smaller in the light receiving section 101 than the light receiving section 102 due to the blocking gate electrode 103. As a result, there will be a difference in the amount of incident light to a substrate between pixels (between the light receiving sections), resulting in poor color balance. In short, when light enters the gate electrodes 103 and 104, the shorter the wavelength of light is, the more the light is decreased in a polysilicon, for example. In addition, the light reflects on the gate electrode in the metal compound gate. Therefore, if the light focusing point is shifted toward the lower side of the light receiving region in the light receiving section due to the longitudinally-tilted oblique light L, the incident light decreases at the lower right corner portion of the light receiving section 101, where the electrode is located, and the amount of the incident light (area of the light receiving region) becomes smaller compared to the light receiving section 102, which has the electrode on the upper right corner portion. As a result, there will be a difference in the area of the light receiving section of incident light. In this case, the signal charge in the light receiving section 101 of "B" decreases for the amount of the incident light lost at the gate electrode 103, compared to the incident light in the light receiving section 102 of "G".

Further, as illustrated in FIG. 9, when distances D1 and D2 between the pixel center F1 for incident light and a wiring layer 111 in the left and right direction, as well as the distances D3 and D4 between the pixel center F1 and a wiring layer 112 in the up and down direction, are not respectively equal, the gate electrode 103 is positioned at the lower right in the light receiving section 101 and the distance D4 is greater than the distance D3, for example. On the other hand, the gate electrode 104 is at the upper right in the adjacent light receiving section 102 (not shown here), which is positioned below the light receiving section 101, and the upper distance D3 is greater than the lower distance D4. Therefore, as described above with reference to FIG. 8, there will be a difference in the area of the light receiving region in each pixel for obliquely-entering incident light, resulting in poor color balance in each light receiving section.

Further, the conventional technique disclosed in Reference 3 is different from the present invention, where the present invention intends not to change the condition of the incident light for each pixel by preventing the incident light into the light receiving section from entering the peripheral portions by surrounding above the light receiving section with a wiring layer within one layer in such a manner to avoid covering the light receiving section. Reference 3 does not discuss the color balance between light receiving sections at all. According to Reference 3, an opening of a shielding film is surrounded even more by a wiring layer in the upper most layer, which is positioned below the shielding film, in order to prevent the incident light from the opening of the shielding film from going around and entering the peripheral portions of a photoelectric conversion region (light receiving region) simply for reduction of smearing. In such a case, if the condition of the incident light is different for each pixel with respect to obliquely-entering light at the opening of the light receiving section, there will be a difference in the areas of the light receiving regions for incident light among light receiving sections, resulting in poor color balance and deterioration of image quality.

The present invention is intended to solve the conventional problems described above. The objective of the present invention is to provide a solid-state image capturing device, which is capable of equally limiting the area of the light receiving region for incident light among the light receiving sections by a wiring layer within one layer, which is limited by its position placed in a predetermined light receiving region in the light receiving section, so that the sensitivity characteristic will be equal for obliquely-entering incident light for each light receiving section. Thus, the occurrence of the color shading difference can be prevented. Further, the objective of the present invention is to provide an electronic information device using the solid-state image capturing device as an image input device in an image capturing section.

A solid-state image capturing device according to the present invention includes a multilayer wiring layer to open regions above a plurality of respective light receiving sections for performing photoelectric conversion on incident light to generate a signal charge; a color filter of each color provided above the multilayer wiring layer in a corresponding manner to each light receiving section; and a microlens provided on the color filter of each color, for focusing the incident light at each light receiving section, wherein a wiring layer within one layer among the multilayer wiring layer limits an area of a light receiving region for incident light that enters the light receiving section, equally among the light receiving sections.

Preferably, in a solid-state image capturing device according to the present invention, the wiring layer within one layer is positioned at a regular distance in up direction and down direction as well as a left direction and a right direction from the center of a unit pixel, the center of the light receiving region of the light receiving section, or a focusing point of light focused from a microlens at the light receiving section, in a plan view, in such a manner to open a portion above the light receiving region.

Still preferably, in a solid-state image capturing device according to the present invention, the opening above the light receiving region, which is opened by the wiring layer within one layer, is positioned towards the side of the center of a unit pixel, the center of the light receiving region of the light receiving section, or a focusing point of light focused from a microlens at the light receiving section, in a plan view, than a charge transfer electrode for transferring a signal charge from the light receiving section to a charge detection section.

Still preferably, in a solid-state image capturing device according to the present invention, the light receiving region is opened at a maximum such that the charge transfer electrode will not enter the opening above the light receiving region from the top in a plan view.

Still preferably, in a solid-state image capturing device according to the present invention, the wiring layer within one layer is positioned in an oval shape having an equal distance in the up and down directions as well as in the left and right directions from the center of the unit pixel, the center of the light receiving region of the light receiving section, or the focusing point of light focused from the microlens, or in a polygon that is circumscribed on the oval shape, from the top, in such a manner to open the portion above the light receiving region.

Still preferably, in a solid-state image capturing device according to the present invention, the wiring layer within one layer is positioned in a circle shape having an equal distance in all the up, down, left and right directions from the center of the unit pixel, the center of the light receiving region of the light receiving section, or the focusing point of light focused from the microlens, or in a polygon that is circumscribed on the circle shape, from the top, in such a manner to open the portion above the light receiving region.

Still preferably, in a solid-state image capturing device according to the present invention, in the opening to open the portion above the light receiving region, an aspect ratio of a space in a longitudinal direction and a space in a transverse direction in the wiring layer within one layer is set to be similar to an aspect ratio of a pixel region that includes the plurality of light receiving sections.

Still preferably, in a solid-state image capturing device according to the present invention, the wiring layer within one layer is at least the lower most wiring layer of the multilayer wiring layer, and the at least the lower most wiring layer limits light that enters the light receiving section.

Still preferably, in a solid-state image capturing device according to the present invention, the wiring layer within one layer is at least one wiring layer of the multilayer wiring layer, and the at least one wiring layer limits light that enters the light receiving section.

Still preferably, in a solid-state image capturing device according to the present invention, the wiring layer within one layer is provided intermittently or consecutively in such a manner to form the opening to open the portion above the light receiving region.

Still preferably, in a solid-state image capturing device according to the present invention, a dummy layer, which is not used as a wiring, is included as the wiring layer within one layer.

Still preferably, in a solid-state image capturing device according to the present invention, the opening to open the portion above the light receiving region is formed by detouring the wiring layer within one layer, cutting off the wiring layer within one layer, protruding the wiring layer within one layer with a predetermined width, and using a dummy layer which is not used as a wiring.

Still preferably, in a solid-state image capturing device according to the present invention, an opening having an area smaller than the light receiving region is opened as the opening to open the portion above the light receiving region, and an opening size of the opening is set such that a focusing spot from the microlens fits inside the opening.

Still preferably, in a solid-state image capturing device according to the present invention, a P well layer is provided in an N-type substrate and an N layer of the light receiving section is provided in the P well layer, or an N well layer is provided in a P-type substrate and a P layer of the light receiving section is provided in the N well layer.

Still preferably, in a solid-state image capturing device according to the present invention, the wiring layer within one layer is positioned with an opening size of the opening set in such a manner that obliquely-entering incident light from a color filter adjacent to the color filter of each color will not enter a light receiving section corresponding to an adjacent color filter of a different color.

Still preferably, in a solid-state image capturing device according to the present invention, the incident light is red color light.

Still preferably, in a solid-state image capturing device according to the present invention, the wiring layer within one layer is formed of a metal material.

Still preferably, in a solid-state image capturing device according to the present invention, the solid-state image capturing device is a MOS image sensor having a charge detection section for converting a signal charge transferred from the light receiving section into voltage, and a signal readout circuit for amplifying voltage converted in the charge detection section according to the converted voltage to be output as an image capturing signal.

Still preferably, in a solid-state image capturing device according to the present invention, elements that constitute the signal readout circuit are connected with one another by the multilayer wiring layer.

Still preferably, a solid-state image capturing device according to the present invention has a multiple pixel sharing structure in which the plurality of light receiving sections share the charge detection section and the signal readout circuit.

Still preferably, in a solid-state image capturing device according to the present invention, when the solid-state image capturing device has a multiple pixel sharing structure in which the plurality of light receiving sections share a charge detection section for converting a signal charge transferred from the light receiving section into voltage and a signal readout circuit for amplifying voltage converted in the charge detection section according to the converted voltage to be output as an image capturing signal, the center of the unit pixel is defined to be the center of each divided region, in which an area occupied by the plurality of light receiving sections, the charge detection section, and the signal readout circuit, is divided by the number of the plurality of light receiving sections equally such that each one of the plurality of light receiving sections is included in each of the divided regions.

Still preferably, in a solid-state image capturing device according to the present invention, the light receiving region of the light receiving section is either rectangular or square, and a charge transfer electrode is positioned across corner portions of the light receiving regions adjacently facing each other in an up and down direction.

Still preferably, in a solid-state image capturing device according to the present invention, the center of the unit pixel corresponds to the center of the light receiving region of the light receiving section, and the center of the unit pixel is arranged in such a manner to have the same pitch in up and down directions as well as left and right directions.

Still preferably, in a solid-state image capturing device according to the present invention, the center of the unit pixel, the center of the light receiving region of the light receiving section, and the focusing point of light focused on the light receiving section by the microlens all correspond to one another, and the center of the unit pixel is arranged in such a manner to have the same pitch in up and down directions as well as left and right directions.

An electronic information device according to the present invention uses the solid-state image capturing device according to the present invention as an image input device in an image capturing section, thereby achieving the objective described above.

The functions of the present invention having the structures described above will be described hereinafter.

According to the present invention, an unit multiple pixel section (a plurality of pixel sections constitute one unit) is composed of: a plurality of light receiving sections, which function as photoelectric conversion sections; a charge detection section for reading out a signal charge from each light receiving section to be converted into a signal voltage; and a plurality of transistors that constitute a signal readout circuit for amplifying the signal voltage converted in the charge detection section according to the signal voltage to be read out as an image capturing signal. Further, at least one layer of multilayer wiring layers, which is above the plurality of light receiving sections arranged in a two dimensional array, is positioned at an equal distance in the up direction and down direction as well as the left and right direction from the center of a unit pixel, the center of the light receiving region of the light receiving section, or a focusing point of light focused from a microlens to the light receiving region, in a plan view, in such a manner to surround a portion above the light receiving section by a predetermined region so as to limit the incident light. Thus, the light receiving area where the obliquely-entering light is shielded is equalized for each light receiving section that is associated with each color of color filters, so that the brightness shading difference resulting from the obliquely-entering light is reduced and the color balance (color shading difference) is improved among the light receiving sections. Thus, due to the wiring layer within one layer (within the same layer), the incident light into the light receiving section is equally limited among the light receiving sections. As a result, the area of the light receiving region for incident light will not change for each pixel, which will affect the color balance and deteriorate the image quality, unlike the conventional technique.

In addition, the wiring layer within one layer is positioned closer towards the center of the light receiving region in a unit pixel section or the side of a focusing point of light focused by a microlens in a top view than a charge transfer electrode for transferring a signal charge from the light receiving section to the charge detection section. Therefore, the difference in the light receiving region for incident light will be prevented among the light receiving sections due to attenuation of incident light by hitting the charge transfer electrode and/or the reflection of incident light from the charge transfer electrode, thereby improving the color balance among the light receiving sections.

Next, regarding crosstalk due to entering of light to light receiving sections of adjacent pixels which correspond to one color filter to another color filter, the present invention will be described based on a conventional technique and the object of the conventional technique.

In general, as a unit pixel is miniaturized, the amount of light entering each light receiving section decreases, resulting in a significant decrease in the sensitivity. Therefore, a structure for increasing the light focusing ratio for each light receiving section is employed by positioning a microlens above each light receiving section.

However, when a pixel is miniaturized, the aspect ratio between the opening width of a photodiode, and the distance between a substrate and a microlens increases. As a result, the effect of obliquely-entering incident light to an adjacent pixel is actualized as crosstalk, thereby causing a mixture of colors.

In order to prevent such a mixture of colors due to the obliquely-entering light, Japanese Laid-Open Publication No. 2003-249633 and Japanese Laid-Open Publication No. 2005-5471, for example, suggest a solid-state image capturing device in which an optical waveguide is provided for each photodiode to guide incident light to a photodiode, so that the light will not enter another photodiode other than one corresponding photodiode.

Further, in order to prevent a mixture of colors due to obliquely-entering light, another structure is suggested for a MOS image sensor. Similar to a CCD image sensor, an N-type substrate is used as a substrate for the MOS image sensor, a P well layer is formed on the N-type substrate, and an N-layer of a light receiving section is provided in the P well layer. As a result, compared to a case where an N-layer of a light receiving section is provided on a P-type substrate, a signal charge (electron) generated deep inside the substrate, such as near an interface between the P well layer and the N-type substrate, is pulled to the N-type substrate side to be diffused to the side of the adjacent pixel.

As an objective of the conventional technique described above, the method for forming the optical waveguide above the photodiode, as described in Japanese Laid-Open Publication No. 2003-249633 and Japanese Laid-Open Publication No. 2005-5471, for example, provides a void on a side wall of the optical waveguide and totally reflects incident light by the inner surface so that the incident light is guided to a light receiving section, or provides a multilayer film and a metal material film on a side wall of the optical waveguide and reflects incident light by the inner surface so that the incident light is guided to a light receiving section. When a metal material is formed for a reflection side wall, there is a possibility that such a metal material touches a surrounding wiring layer due to a variation of the manufacturing process and causes a short-circuit. No matter what kind of material film is used, the manufacturing process and cost will increase, and it is not technically easy to manufacture an optical waveguide structure with a good accuracy.

Further, the method that uses the N-type substrate as a substrate is able to reduce the effect due to the fact that a signal charge photoelectrically converted deep in the substrate is diffused to a photodiode in an adjacent pixel, as described above. However, the method is not able to prevent crosstalk if the angle of obliquely-entering incident light becomes great and the incident light directly enters from one color filter to an adjacent pixel that corresponds to a different color.

For example, incident lights E1 and E2 enter at the same angle from an oblique direction to an X direction and a Y direction as illustrated in FIGS. 11(a) and 11(b). The incident light E1 in the X direction is reflected by an upper surface of a first layer of a metal wiring layer 111 in FIG. 11(a), whereas, in FIG. 11(b), the first layer of the metal wiring layer 111 does not exist in the Y direction, and the incident light E2 in the Y direction directly passes through an interlayer insulation layer 118, the incident light having an adjacent color component directly enters a light receiving section of an adjacent pixel that is adjacent to a light receiving section 101, causing a mixture of colors (crosstalk). In particular, a red light, which is on the side of a long wavelength in a visible light, advances deep inside the substrate more than any other colors, and therefore, obliquely-entering incident light advances inside the substrate to a light receiving section (photoelectric conversion section) of an adjacent pixel, so that the color of an adjacent color filter is mixed, causing a mixture of colors (crosstalk).

On the other hand, according to the present invention, incident light is limited by surrounding an incident region (above a light receiving region) above a light receiving section for obliquely-entering light in order to prevent a mixture of colors in at least one layer of multilayer wiring layers, so that light entered in a color filter of an adjacent color will be prevented from entering a light receiving section of an adjacent pixel, thereby reducing a mixture of colors. It is preferable to set a position of a surrounded opening above the light receiving region by at least one layer of the multilayer wiring layer, so that red light obliquely entered in a color filter of an adjacent color will not enter an adjacent light receiving section (photoelectric conversion section). Thus, it is possible to more reliably prevent light entered in a color filter of an adjacent color from entering an adjacent light receiving section.

In addition to this, when an N-type substrate is used as a substrate, a P well layer is formed on the N-type substrate, and an N-layer of a light receiving section is provided in the P well layer, a signal charge (electron) generated deep inside the substrate, such as near an interface between the P well layer and the N-type substrate, is pulled to the N-type substrate side due to red color light that advances deep inside the substrate, so that the signal charge will not be diffused to the side of the adjacent pixel. As a result, a mixture of colors (crosstalk) in the substrate, where the signal charge advances to a light receiving section in an adjacent pixel inside the substrate and the color of an adjacent color filter is mixed, will be prevented.

According to the present invention with the structure described above, a wiring layer within one layer positioned above a light receiving section, which functions as a photoelectric conversion section, is positioned at an equal distance in the up directions and down direction as well as the left and right directions from the center of a unit pixel, the center of the light receiving region of the light receiving section, or a focusing point of light focused from a microlens, in a plan view, in such a manner that the wiring layer within one layer surrounds the light receiving region of the light receiving section so as to limit the incident light that enters the light receiving section. As a result, the area of the light receiving region of the light receiving section where obliquely-entering incident light enters becomes equal for each light receiving section that corresponds to a color filter of each color, thereby reducing the difference in brightness shading caused by obliquely-entering light and improving color balance (difference in color shading) between light receiving sections.

Further, the wiring layer within one layer is provided towards the center of a unit pixel, the center of the light receiving region of the light receiving section, or a focusing point of light focused from a microlens, than a position of a charge transfer electrode of a charge transfer transistor in a plan view, so that the difference in the light receiving region for incident light will be prevented among the light receiving sections due to attenuation of incident light by hitting the charge transfer electrode and/or the reflection of incident light from the charge transfer electrode, thereby improving the color balance among the light receiving sections.

Further, by equalizing the distances of the wiring layer within one layer in up and down direction (longitudinal direction) and left and right direction (transverse direction) from the center of the unit pixel or the focusing point of light focused by the microlens as described above, the incident light entering the microlens above the light receiving section is prevented from entering another light receiving section of a pixel adjacent to the light receiving section, thereby reducing a mixture of colors (crosstalk). In particular, a mixture of colors (crosstalk) to an adjacent pixel can be controlled by setting the position of the wiring layer within one layer inside the substrate such that red color light entering obliquely will not enter an adjacent light receiving section.

These and other advantages of the present invention will become apparent to those skilled in the art upon reading and understanding the following detailed description with reference to the accompanying figures.

BRIEF DESCRIPTION OF THE DRAWINGS

FIG. 5(a) is a longitudinal cross sectional view illustrating a pixel structure when incident light is a parallel light. FIG. 5(b) is a longitudinal cross sectional view illustrating a pixel structure when incident light is an oblique light.

FIG. 6(a) is a longitudinal cross sectional view illustrating a pixel structure when incident light is a parallel light. FIG. 6(b) is a longitudinal cross sectional view illustrating a pixel structure when incident light is an oblique light.

Figure 1:
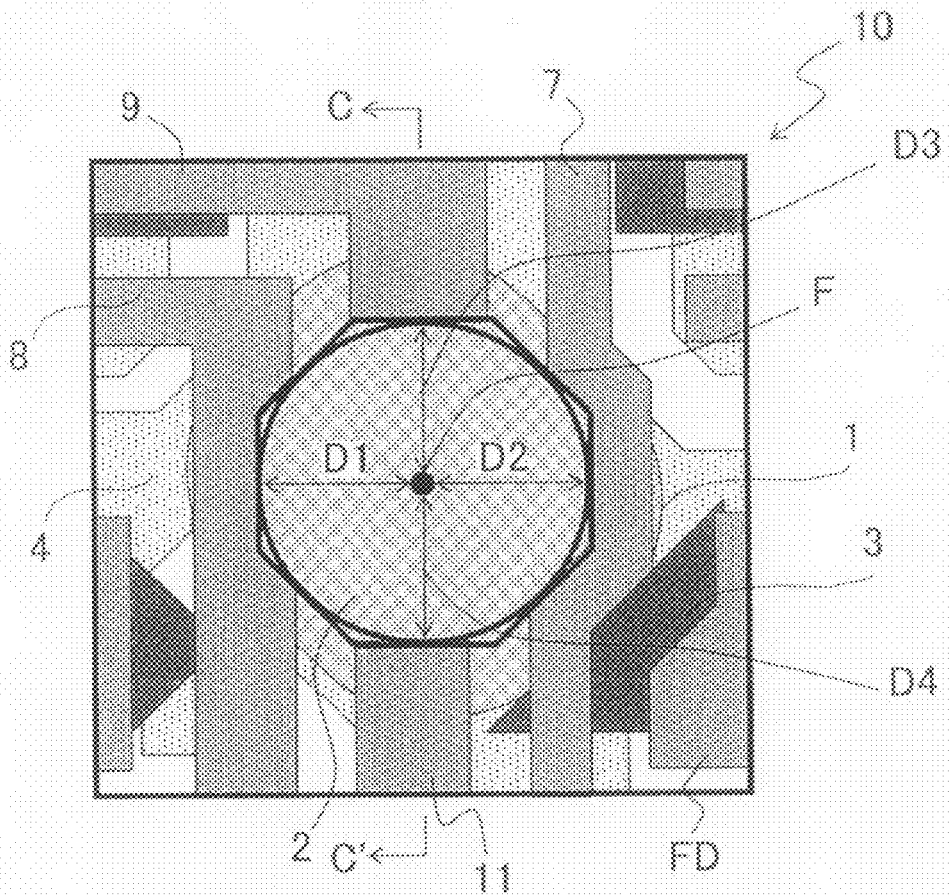
FIG. 1 is an enlarged top view schematically illustrating an exemplary unit pixel in a solid-state image capturing device according to Embodiment 1 of the present invention.

10, 10A MOS image sensor (solid-state image capturing device)
1 N-type layer (light receiving section) constituting a photodiode
2, 2A opening
3 charge transfer electrode (gate electrode)
4 P-type separation region (element separation region)
5 amplifying transistor
6 reset transistor
7 to 9, 9A, 11, 11A first layer of metal wiring layer
12 N-type substrate
13 P-type well layer
14 second layer of metal wiring layer
15 third layer of metal wiring layer
16 interlayer insulation film
17 color filter of each color
18 microlens
21 blue color photoelectric conversion region
22 green color photoelectric conversion region
23 red color photoelectric conversion region
30 electronic information device
31 solid-state image capturing apparatus
32 memory section
33 display section
34 communication section
35 image output section
E11, E12 incident light
F light focusing point for incident light
D1 to D4 distance between point F to wiring layer
D diameter of a circle opening formed by first layer of wiring layer
e (−) generated electric charge (electron)

DESCRIPTION OF THE PREFERRED EMBODIMENTS

Hereinafter, Embodiments 1 and 2 of a solid-state image capturing device according to the present invention will be described with reference to the accompanying figures, where the embodiments will be applied to a MOS image sensor. Further, Embodiment 3 will be described with reference to the accompanying figures, with regard to an electronic information device as a finished product, having the solid-state image capturing device according to Embodiments 1 and 2 of the present invention as an image input device in an image capturing section.

Embodiment 1

FIG. 1 is an enlarged top view schematically illustrating an exemplary unit pixel in a solid-state image capturing device according to Embodiment 1 of the present invention.

In FIG. 1, the periphery of a unit pixel section in a MOS image sensor 10, as the solid-state image capturing device according to Embodiment 1, is surrounded by a wiring layer in one layer such that an area above a light receiving region of a light receiving section 1 is opened by an opening 2, the light receiving section 1 constituting a unit pixel section. At the lower right portion of the light receiving section 1, a charge transfer electrode 3 (gate electrode) is positioned for transferring a signal charge from the light receiving section 1 to a floating diffusion FD, which functions as a charge detection section. An element separation region 4 (element separation layer) is formed around the light receiving section 1 to separate a plurality of light receiving sections 1 from each other. Even if the opening 2, which has a smaller area than the area of the light receiving region, above the light receiving region of the light receiving section 1, almost all the amount of incident light can be secured by setting a light focusing spot from a microlens within the opening 2.

In a plan view, the wiring layer within one layer among multilayer wiring layers above the light receiving section 1 is positioned at an equal distance in an up direction and a down direction as well as a left direction and a right direction from the center of a unit pixel, the center of the light receiving region of the light receiving section 1, or a focusing point F of light focused from a microlens, such that the opening 2 opens the light receiving region. Incident light that enters the light receiving section 1 is limited by the wiring layer within one layer. At a location distant by a distance D1 in the left direction from the center of a unit pixel, the center of the light receiving region of the light receiving section 1, or a focusing point F of light focused from the microlens, a first layer of a wiring layer 8 is provided (the wiring layer 8 will be discussed later with reference to FIG. 2). Further, at a location distant by a distance D2 in the right direction from the center of a unit pixel, the center of the light receiving region of the light receiving section 1, or a focusing point F of light focused from the microlens, a first layer of a wiring layer 7 is provided as a signal line. In addition, at a location distant by a distance D3 in the up direction from the center of a unit pixel, the center of the light receiving region of the light receiving section 1, or a focusing point F of light focused from the microlens, a first layer of a wiring layer 9 is provided, the wiring layer 9 being protruded by a predetermined width (length of an edge of a polygon) from a reset control signal line layer. In addition, at a location distant by a distance D4 in the down direction from the center of a unit pixel, the center of the light receiving region of the light receiving section 1, or a focusing point F of light focused from the microlens, a first layer of a wiring layer 11 is provided, the wiring layer 11 being a dummy wiring layer and having a predetermined width.

Herein, there is a circle with a radius of the distance D1 with the focusing point F as the center and the distance D1=the distance D2=the distance D3=the distance D4. The opening 2, which is formed by metal wiring layers above the light receiving section 1, is surrounded by wiring layers 7 to 9 and 11 within one layer in a discontinuous circle shape. The opening 2 is circumscribed on the circle with the radius of the distance D1. In order to form an octagon having the length of the edge the same, the wiring layer 7 may be curved, a side edge portion of the wiring layer 8 may be cut off, a predetermined width of the first layer of the wiring layer 11 and wiring layer 9, which are dummy wiring layers, may be protruded, and a total dummy wiring may be provided as a wiring layer within one layer, such as the wiring layer 11.

Further, the wiring layer within one layer that opens above the light receiving region is positioned towards the center of the unit pixel, the center of the light receiving region of the light receiving section 1, or a focusing point side (inner side) of light focused from the microlens, than the position of the charge transfer electrode 3. In short, what is important is that the charge transfer electrode 3 is positioned below the wiring layer within one layer or the circumference side of the opening 2, and that the charge transfer electrode 3 is not positioned in the region of the light receiving section 1 inside the opening 2. If the charge transfer electrode 3 is positioned in the region of the light receiving section 1 inside the opening 2, a directivity is created in the region shape (a shape in which the charge transfer electrode 3 is removed from the region of the light receiving section 1 inside the opening 2) of the light receiving section 1 inside the opening 2. As a result, if obliquely-entering light from a certain direction enters causing the light focusing spot from the microlens to be shifted and the light hits the charge transfer electrode 3, there will be a difference in the area of the light receiving region for incident light between light receiving sections 1, causing the color balance to be deteriorated.

The center of the unit pixel is defined as the center of each divided region, in which area occupied by a plurality of light receiving sections 1, the floating diffusion FD functioning as a charge detection section, and a signal readout circuit for reading out a signal from the light receiving section 1, is divided by the number of the plurality of light receiving sections equally such that each one of the plurality of light receiving sections 1 is included in each of the divided regions. A case will be described where the center of the unit pixel, the center of the light receiving region of the light receiving section 1, and the focusing point of light focused from the microlens are all aligned, as well as the light receiving sections 1 are arranged such that the center of the unit pixel will have an equal pitch in the up and down direction and in the left and right direction. However, without the limitation to this, the center of the unit pixel may be aligned with the center of the light receiving region of the light receiving section 1, and the light receiving sections 1 may be arranged such that the center of the unit pixel will have an equal pitch in the up and down direction as well as the left and right direction. Further, even if the center of the unit pixel or the center of the light receiving region of the light receiving section 1 does not have an equal pitch in the up and down direction as well as the left and right direction, what is required is that the focusing point of light focused on the light receiving section 1 by the microlens and the center of the opening 2 are aligned. It is desirable to include the light receiving region as much as possible without including the charge transfer electrode 3 inside the opening 2. In order to include the light receiving region of the light receiving section 1 as much as possible in the opening 2, it is required that the focusing point of light focused on the light receiving section 1 by the microlens and the center of the opening 2 are aligned. However, this requirement is not always necessary. Therefore, what is required is that the center of the opening 2 is aligned with at least any of the center of the unit pixel, the center of the light receiving region of the light receiving section 1, and the focusing point of light focused on the light receiving section 1 by the microlens. For example, the center of the opening 2 may be shifted from the center of the light receiving region of the light receiving section 1 without alignment.

The wiring layers 7 to 9 and 11 within one layer described above are illustrated in FIG. 2, as wiring layers that connect elements of signal readout circuits in respective pixels, the wiring layers being provided in the periphery of the opening 2 above the light receiving section 1 by metal wring layers.

Figure 2:
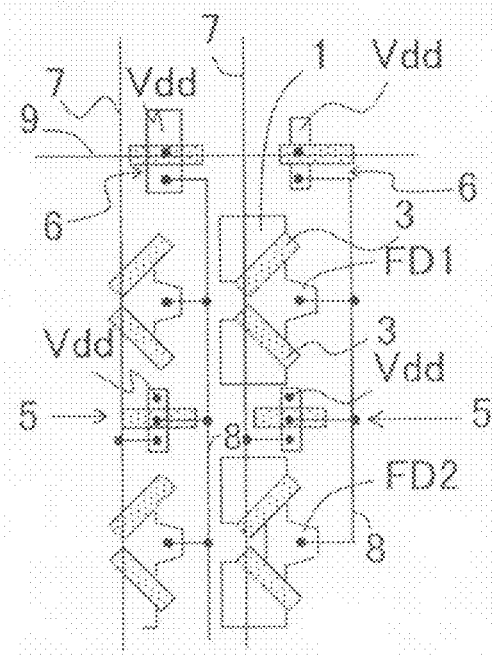
FIG. 2 is a top view schematically illustrating an exemplary pixel arrangement of a four-pixel sharing structure in the solid-state image capturing device in FIG. 1.

FIG. 2 is a top view schematically illustrating an exemplary pixel arrangement of a four-pixel sharing structure in the solid-state image capturing device in FIG. 1. Note that the unit pixel in FIG. 1 corresponds to the upper most unit pixel in FIG. 2.

In FIG. 2, the MOS image sensor 10 according to Embodiment 1 has a four-pixel sharing structure, in which four light receiving sections 1 arranged in a longitudinal direction share floating diffusions FD1 and FD2, and signal readout circuits such as an amplifying transistor 5 and a reset transistor 6. A signal charge is transferred from the four light receiving sections 1 consecutively through a channel region below the gate electrode 3 to a shared floating diffusion FD1 or FD2. Subsequently, the signal charge is converted into signal voltage. The signal voltage is amplified by the amplifying transistor 5 of a source follower to be output as an image capturing signal to a signal line 7. The floating diffusions FD1 and FD2 are reset by the reset transistor 6 with power source voltage after outputting the signal to the signal line 7. In such a case, the wiring layer 8 is connected to the source of the reset transistor 6, the floating diffusions FD1 and FD2, and a gate electrode of the amplifying transistor 5. The wiring layer 9 is a reset control signal line layer positioned in a transverse direction, the wiring layer connected between a signal output terminal of a reset control driver and a gate electrode of each reset transistor 6. The wiring layers 7 to 9 are composed of the lower most, first wiring layer within one layer among the multilayer wiring layers.

Figure 3:
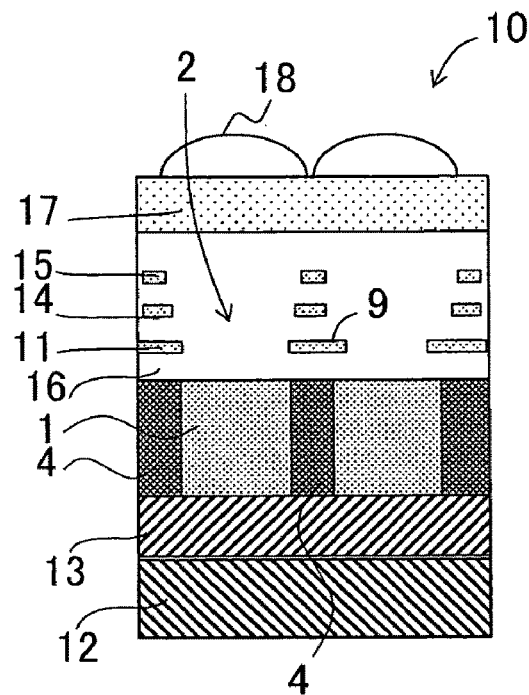
FIG. 3 is a longitudinal cross sectional view of two pixels along the line C-C' in FIG. 1.

FIG. 3 is a longitudinal cross sectional view of two pixels along the line C-C' in FIG. 1.

In FIG. 3, the MOS image sensor 10 according to Embodiment 1 includes a P-type well region 13 formed on an N-type substrate 12. In the P-type well region 13, a light receiving section 1, which is composed of an N-type region, for constituting a photodiode, is provided. Around the light receiving section 1, a P-type separation region 4 is provided as a pixel separation region, the P-type separation region having a higher concentration than the P-type well region 13. In addition, as a multilayer wiring layer for operating the light receiving section 1 functioning as a pixel section to read out a signal, a first layer of metal wiring layers 9 and 11 for surrounding the light receiving region for incident light (wiring layers 7 and 8 are not illustrated here), a second layer of a metal wiring layer 14, and a third layer of a metal wiring layer 15 are provided in an interlayer insulation film 16. Further, a color filter 17 of each color is provided above a pixel in a corresponding manner to each light receiving section 1. Further, a microlens 18 is provided for focusing light at the light receiving section 1, on the color filter 17.

Figure 4:
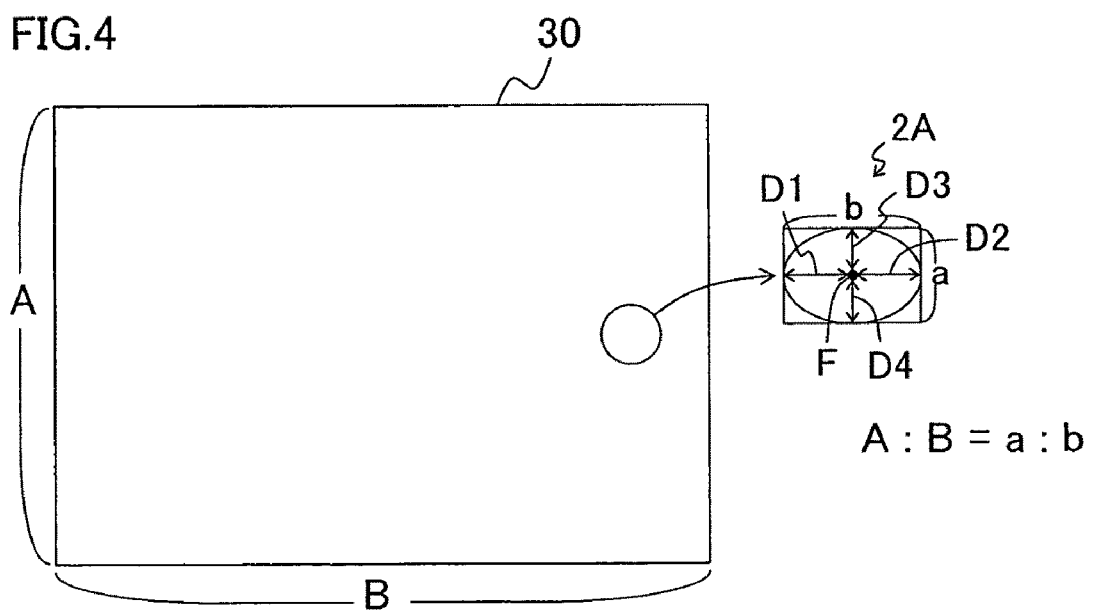
FIG. 4 is a top view schematically illustrating a relationship between an aspect ratio of a pixel region and an aspect ratio of a rectangular opening above a light receiving section opened by a wiring layer.

In Embodiment 1, a case has been described where the opening 2 is configured in a circle shape or a polygon (equilateral octagon herein) that is circumscribed on the circle shape, the circle shape having equal spaces between the wiring layer 9 and the dummy wiring layer 11 in the up and down direction in the opening 2 (distance D3+distance D4) as well as between the wiring layer 8 and the wiring layer 7 in the left and right direction in the opening 2 (distance D1+distance D2), with 1:1 ratio. Without the limitation to this, it is desirable that the ratio of the space between the wiring layer 9 and the dummy wiring layer 11 in the up and down direction in the opening 2 (distance D3+distance D4; distance D3=distance D4) as well as the space between the wiring layer 8 and the wiring layer 7 in the left and right direction in the opening 2 (distance D1+distance D2; distance D1=distance D2) be set a ratio similar to the aspect ratio of a pixel region 30 (image capturing region) that includes a plurality of light receiving sections 1 and the signal readout circuits and the like, as illustrated in FIG. 4. In such a case with a rectangular shape, an opening 2A is configured to be an oval shape that is inscribed in the rectangle or a polygon that is circumscribed on the rectangular, having the ratio of a:b with different ratio of the longitudinal "a" and transverse "b". With regard to the opening 2 of Embodiment 1, because the ratio of the longitudinal "a" and transverse "b" are equal (distance D1+distance D2=distance D3+distance D4), the aspect ratio of the pixel region (image capturing region) is equal in this case, and the region is square. In other words, it is desirable that the opening 2 be configured in a circle shape having an equal ratio of the longitudinal "a" and transverse "b" of the opening 2 or a polygon that is circumscribed on the circle shape (equilateral octagon herein) when the pixel region (image capturing region) is square.

According to Embodiment 1, a case has been described where the opening 2 is configured in a circle shape or a polygon that is circumscribed on the circle shape (equilateral octagon herein) by surrounding predetermined regions above the light receiving section 1 intermittently or discontinuously with the wiring layer 9 and the dummy wiring layer 11 in the up and down direction as well as the wiring layer 8 and the wiring layer 7 in the left and right direction in the metal wiring layer within one layer. Without the limitation to this, the metal wiring layer within one layer may be positioned consecutively in a circle shape or a polygon that is circumscribed on the circle shape (equilateral octagon, for example), the circle shape having the same distance in all the directions of the up, down, left and right directions in a plan view from the center of the unit pixel, the center of the light receiving region of the light receiving section 1, or a focusing point F of light focused from the microlens 18.

Embodiment 2

In Embodiment 1, it has been described that the area of the light receiving region for incident light entering each light receiving section 1 is equally limited by the wiring layers 7 to 9 and 11 within one layer, which are limitedly positioned in a predetermined light receiving region above the light receiving section 1 so as to equalize the sensitivity characteristics for obliquely-entering incident light for each light receiving section 1, thereby controlling the occurrence of the difference in color shading. In Embodiment 2, in addition to or alternatively to this, a case will be described where a mixture of colors (crosstalk) is prevented due to light entering from a color filter of one color to a light receiving section 1 in an adjacent pixel corresponding to a color filter of a different color, by the wiring layers 7 to 9 and 11 within one layer that are limitedly positioned in a predetermined region above the light receiving section 1.

Figure 5:
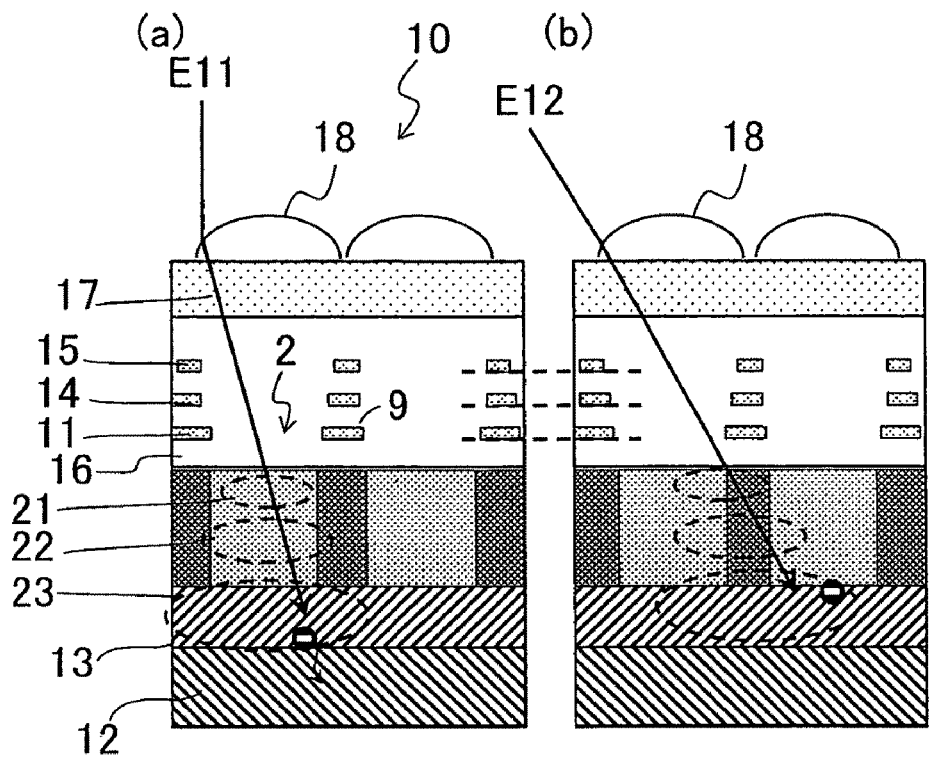
FIG. 5 is a longitudinal cross sectional view for comparison so as to describe a mixture of colors in a solid-state image capturing device according to Embodiment 2 of the present invention, which is a longitudinal cross sectional view of two pixels along C-C' in the solid-state image capturing device in FIG. 3.
Figure 6:
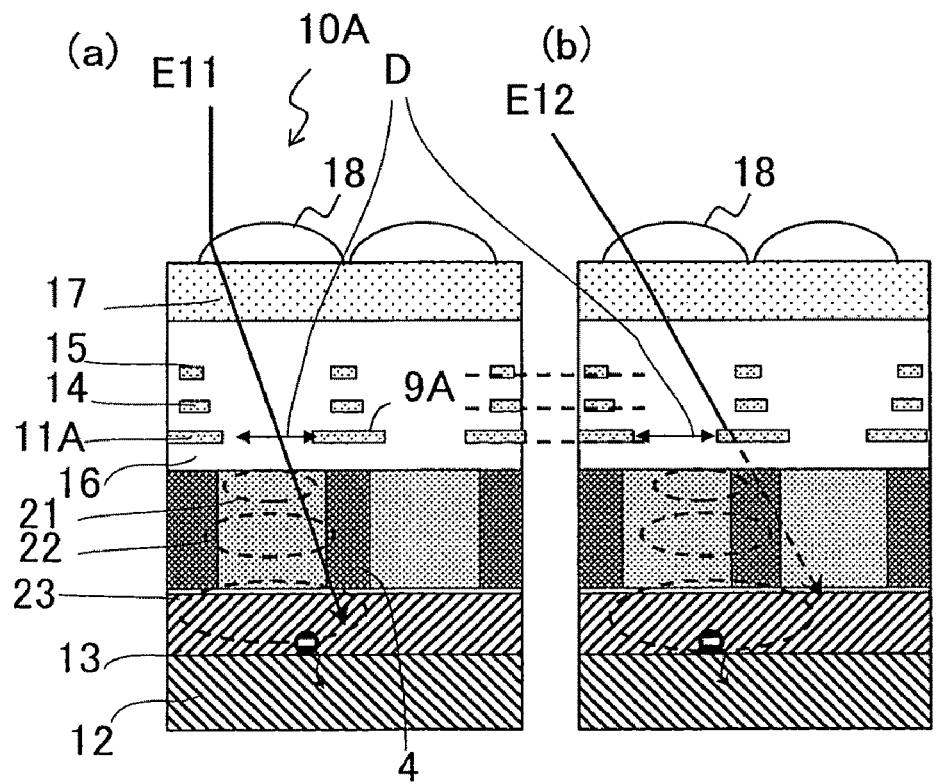
FIG. 6 is a longitudinal cross sectional view illustrating a mixture of colors in the solid-state image capturing device according to Embodiment 2 of the present invention, which is a longitudinal cross sectional view illustrating a pixel structure of a case where the metal wiring layer in FIG. 3 is adjusted to be positioned in order not to cause a mixture of colors.

FIG. 5 is a longitudinal cross sectional view for comparison so as to describe a mixture of colors in a solid-state image capturing device according to Embodiment 2 of the present invention, which is a longitudinal cross sectional view of two pixels along C-C' in the solid-state image capturing device in FIG. 3. FIG. 5(a) is a longitudinal cross sectional view illustrating a pixel structure when incident light is a parallel light. FIG. 5(b) is a longitudinal cross sectional view illustrating a pixel structure when incident light is an oblique light. In addition, FIG. 6 is a longitudinal cross sectional view illustrating a mixture of colors in the solid-state image capturing device according to Embodiment 2 of the present invention, which is a longitudinal cross sectional view illustrating a pixel structure of a case where the metal wiring layer in FIG. 3 is adjusted to be positioned in order not to cause a mixture of colors. FIG. 6(a) is a longitudinal cross sectional view illustrating a pixel structure when incident light is a parallel light. FIG. 6(b) is a longitudinal cross sectional view illustrating a pixel structure when incident light is an oblique light. In FIGS. 5 and 6, the same reference numerals are denoted for the members that have the same function and effect as the members in FIG. 3.

As illustrated in FIGS. 5 and 6, a MOS image sensor 10A according to Embodiment 2 includes a P-type well region 13 on an N-type substrate 12 as similar to the case in Embodiment 1 described above. Inside the P-type well region 13, a plurality of light receiving sections 1 of an N-type layer are provided repetitively at a predetermined pitch, the light receiving section constituting a photodiode. Around each of the light receiving sections 1, a P-type separation region 4 is provided as a pixel separation region. In addition, as a metal wiring layer for connecting elements that operate to read out a signal from the light receiving section 1 constituting a pixel section, a first layer of metal wiring layers 7A to 9A and 11A (wiring layers 9A and 11A are illustrated here), a second layer of a metal wiring layer 14, and a third layer of a metal wiring layer 15 are provided by being embedded in an interlayer insulation film 16 in FIG. 5, where the first layer of metal wiring layers 7A to 9A and 11A further reduce the opening 2 inwardly in order to prevent crosstalk and narrow the light receiving region of the light receiving section 1 to the wiring layer space D, as opposed to the first layer of the metal wiring layers 7 to 9 and 11 (the wiring layers 9 and 11 are illustrated here) in FIG. 5. Further, a color filter 17 of each color is provided above a pixel in a corresponding manner to each light receiving section 1. A microlens 18 is provided on the color filter 17 of each color for focusing incident light at a light focusing spot in the light receiving section 1.

With the structure described above as a prerequisite, a case will be described where the position of the metal wiring layer within one layer is adjusted in order to prevent a mixture of colors.

Figure 9:
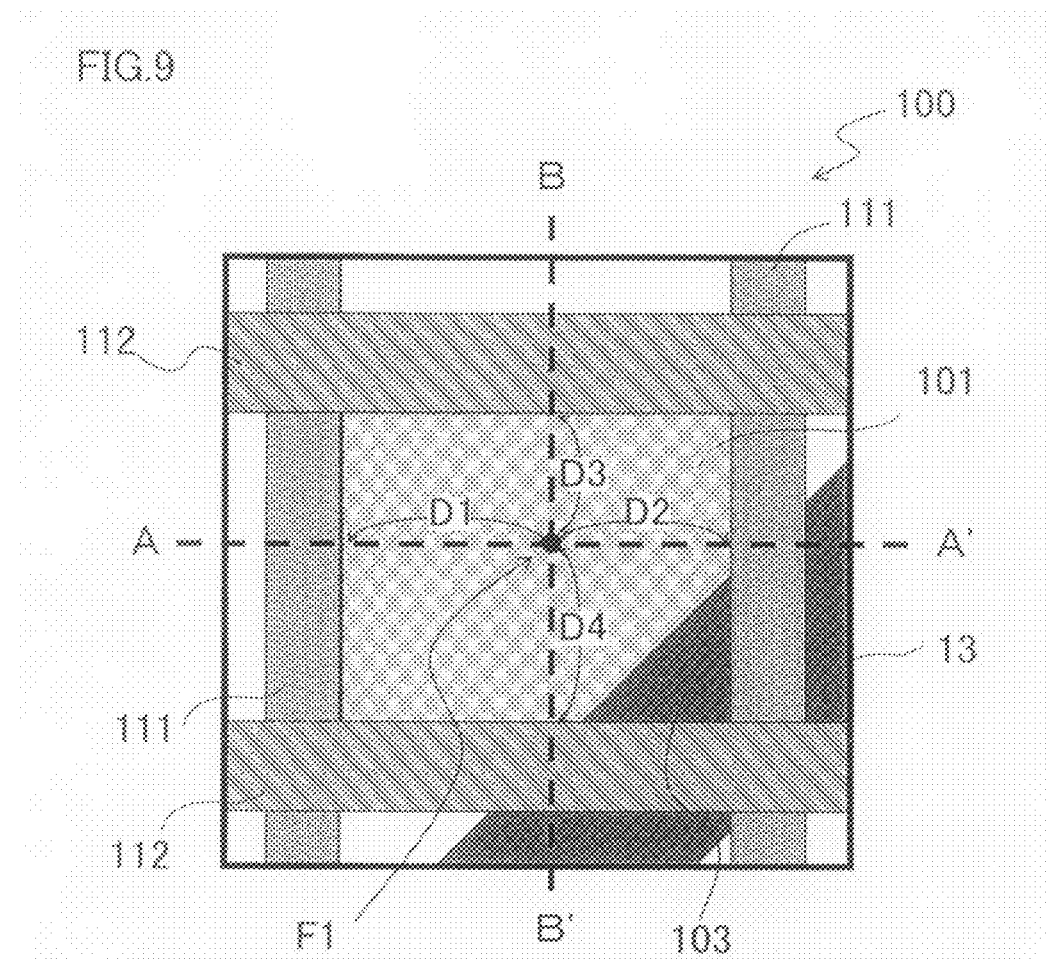
FIG. 9 is an enlarged top view schematically illustrating one pixel structure in the solid-state image capturing device in FIG. 8.
Figure 10:
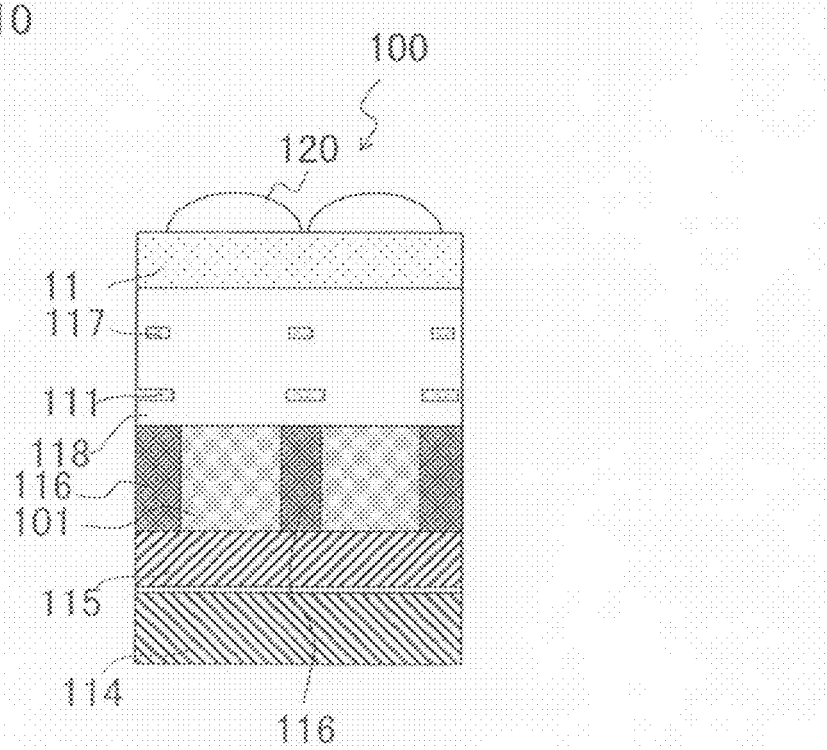
FIG. 10 is a longitudinal cross sectional view of two pixels in the A-A' direction in FIG. 9.
Figure 11:
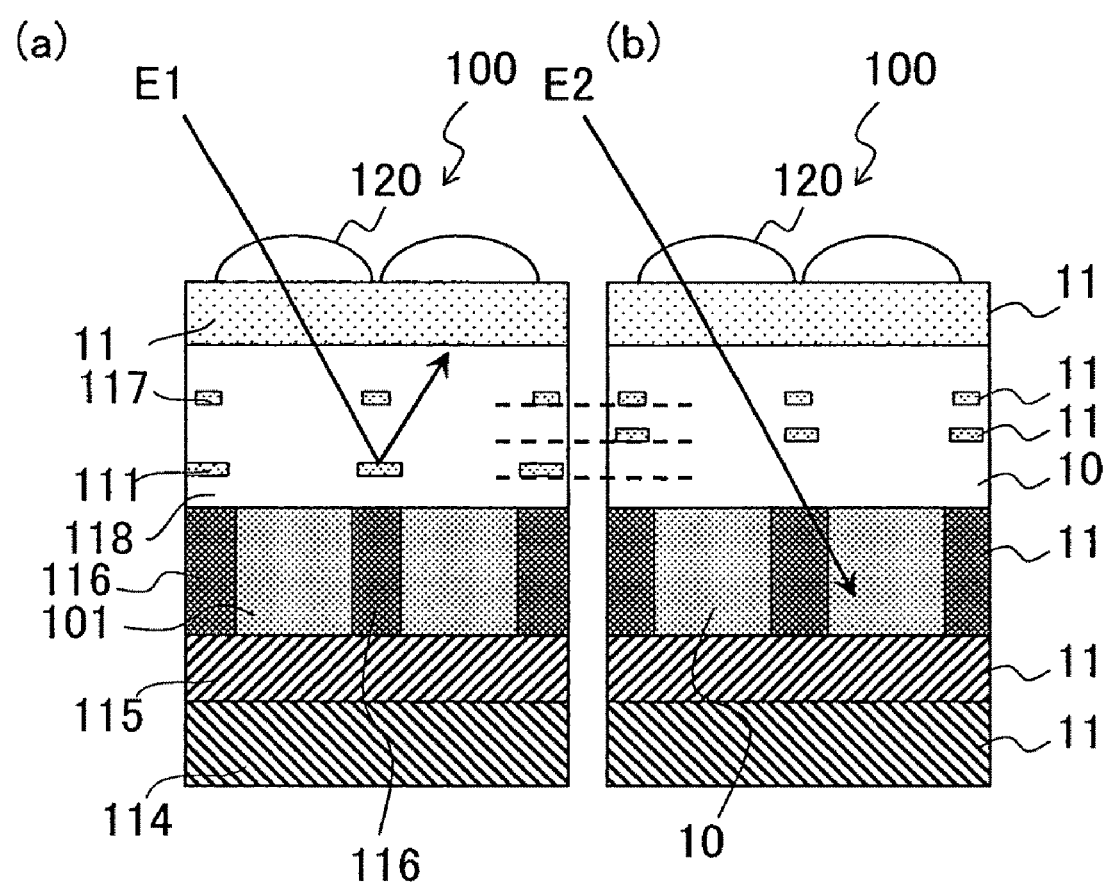
FIG. 11 is a longitudinal cross sectional view of two pixels, describing occurrence and non-occurrence of crosstalk in accordance with the A-A' direction and the B-B' direction in FIG. 9.

As illustrated in FIGS. 11(a) and 11(b), when light E1 and light E2 enter at the same angle with regard to X direction (left and right direction, A-A' direction in FIG. 9) and Y (up and down direction, B-B' direction in FIG. 9) direction in a conventional MOS image sensor 100, one light E1 is reflected by a first layer of a metal wiring layer 111, whereas the other light E2 enters a light receiving section in an adjacent pixel without being reflected by the first layer of the metal wiring layer 111 since there is no first layer of the metal wiring layer 111 provided. Thus, the condition of each incident light is different for each pixel, thereby causing crosstalk and deteriorating the image quality.

Therefore, the first layer of the metal wiring layer, which exists between adjacent pixels, is positioned both in the up and down direction and in the left and right direction, instead of either of the X directions (left and right direction, A-A' direction in FIG. 9) and the Y directions (up and down direction, B-B' direction in FIG. 9), in Embodiment 2. Even if the wiring layer is positioned as the wiring layer within one layer both in the up and down direction and in the left and right direction, the color balance between the light receiving sections 1 will be affected as described in Embodiment 1 if the distance is not equal from the center of the unit pixel, the center of the light receiving region of the light receiving section 1, or the focusing point F of light focused from the microlens 18 to the wiring layer within one layer.

Further, similar to Embodiment 1, the metal wiring layer within one layer is positioned at equal distance from the center of the unit pixel, the center of the light receiving region of the light receiving section 1, or the focusing point F of light focused from the microlens 18, so that the area of the light receiving region for incident light in the light receiving section 1 from each direction of up, down, left and right will be equal. As a result, the difference in color shading due to the difference in brightness shading can be controlled.

In this case, as illustrated in FIG. 5(a), incident light E11 that enters a substrate is absorbed from a silicon substrate surface into the substrate successively from the short wavelength side, so that a signal charge is generated. The enclosures with a dashed line in FIG. 5(a) respectively illustrate regions where a blue color 21, a green color 22 and a red color 23 are photoelectrically converted. In such a case, the red color light on the long wavelength side in a visible light advances 2 μm to 4 μm in depth to the substrate. Therefore, when oblique light E12 enters as illustrated in FIG. 5(b), the light passes inside the substrate and advances a photodiode of a light receiving section 1 in an adjacent pixel.

Thus, as illustrated in FIG. 6(a), for example, the diameter D of an inscribed circle, which is defined by the metal wiring layers 7A to 9A and 11A within one layer, is adjusted within a range where red color light, which has a long wavelength in a visible light, does not advance to an adjacent photodiode in the substrate. As a result, even if oblique light E12 enters as illustrated in FIG. 6(b), the light will be shielded by the metal wiring layer 11A within one layer and the light will not advance to the photodiode in the adjacent pixel, thereby further reducing crosstalk to the adjacent pixel.

According to Embodiments 1 and 2 with the structure described above, the wiring layer within one layer above the light receiving section, which constitutes the photodiode, is positioned at equal distance from the center of the unit pixel (light receiving section), the center of the light receiving region of the light receiving section 1, or the focusing point F of light focused from the microlens 18 in the up and down directions as well as in the left and right directions in a plan view, so that the areas of the light receiving regions for incident light in respective light receiving sections will be equal by the wiring layer within one layer, thereby controlling the color balance (difference in color shading) between the light receiving sections. Further, the wiring layer within one layer in a plan view is formed towards inside (to the side of the center of the unit pixel, the center of the light receiving region of the light receiving section 1, or the focusing point F of light focused from the microlens 18) than the charge transfer electrode 3. As a result, the color balance (difference in color shading) can be controlled between the light receiving sections due to obliquely-entering incident light to each light receiving section constituting the photodiode. Further, the crosstalk to an adjacent pixel can be controlled by adjusting the position of the opening 2 formed by the wiring layer within one layer.

In Embodiment 2, the metal wiring layer within one layer is positioned in a shape of a polygon in a plan view that is circumscribed on a circle shape having an equal distance in the up and down directions as well as in the left and right directions from the center of the unit pixel or the microlens 18. Without limitation to this, the ratio of the spaces in the up and down directions and the left and right directions of the wiring layer can be set in accordance with the aspect ratio of the pixel region. In a case with a rectangular pixel region, it is preferable to position the metal wiring layer within one layer in a shape of a polygon in a plan view that is circumscribed on a oval shape having an equal distance in the up and down directions as well as in the left and right directions from the center of the unit pixel or the microlens 18.

In addition, although not described in particular in Embodiments 1 or 2 described above, the effect due to the difference in the condition of incident light as described above appears not only in the first layer but also in the second layer and above. Therefore, it is preferable to position the wiring in the second layer and above in both the up and down directions and the left and right directions.

Embodiment 3

Figure 7:
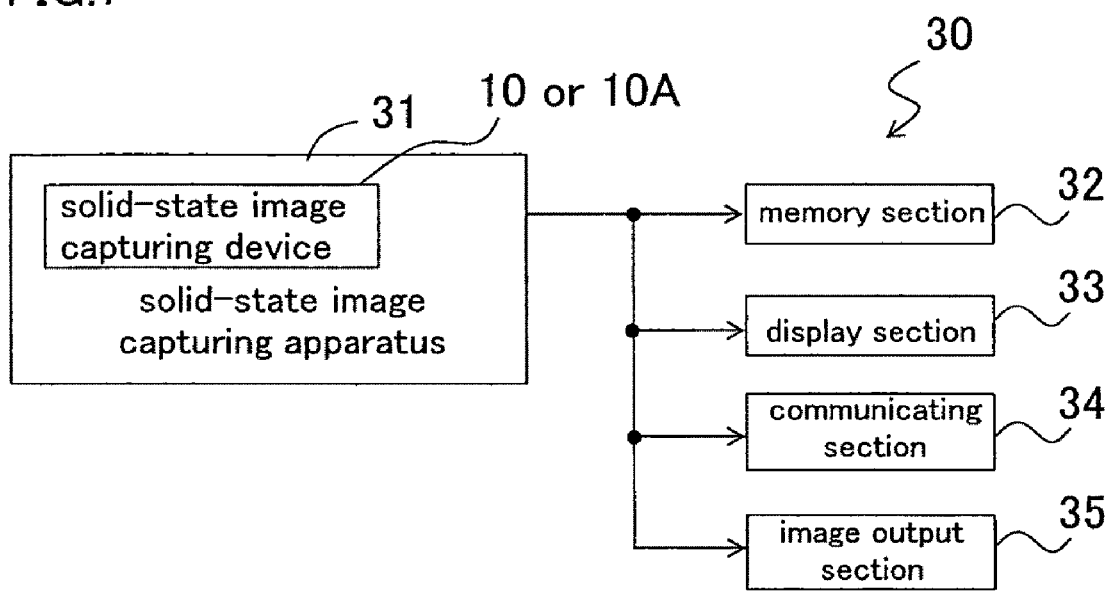
FIG. 7 is a block diagram illustrating an exemplary diagrammatic structure of an electronic information device, as Embodiment 3 of the present invention, using a solid-state image capturing device according to any of Embodiments 1 to 2 of the present invention as an image input device in an image capturing section.
Figure 8:
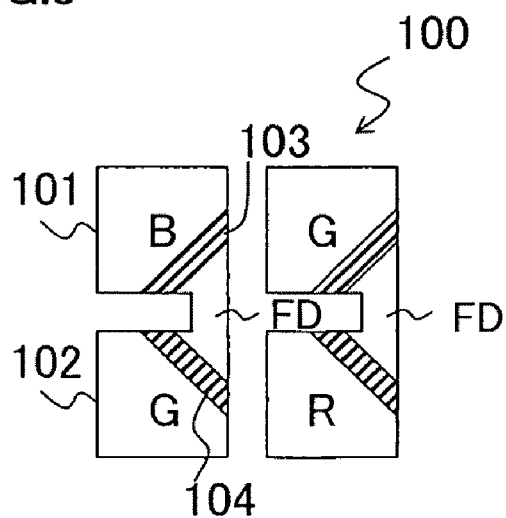
FIG. 8 is a top view schematically illustrating a conventional pixel arrangement of a two pixel sharing structure.

FIG. 7 is a block diagram illustrating an exemplary diagrammatic structure of an electronic information device, as Embodiment 3 of the present invention, using a solid-state image capturing device according to any of Embodiments 1 to 2 of the present invention as an image input device in an image capturing section.

In FIG. 7, the electronic information device 30 according to Embodiment 3 of the present invention includes: a solid-state image capturing apparatus 31 having a signal processing section for performing predetermined signal processing on a color image capturing signal from the solid-state image capturing devices 10 or 10A according to Embodiment 1 or 2; a memory section 32 (e.g., recording media) for data-recording a color image data from the solid-state image capturing apparatus 31 after a predetermined signal process is performed on the image data for recording; a display section 33 (e.g., a color liquid crystal display apparatus and a color EL display apparatus) for displaying the color image data from the solid-state image capturing apparatus 31 on a display screen (e.g., liquid crystal display screen) after predetermined signal processing is performed on the color image data for display; a communication section 34 (e.g., a transmitting and receiving device) for communicating the color image signal from the solid-state image capturing apparatus 31 after predetermined signal processing is performed on the image signal for communication; and an image output section 35 for printing the color image signal from the solid-state image capturing apparatus 31 after predetermined signal processing is performed for printing. Thus, the electronic information device 30 according to Embodiment 3 may include all of the memory section 32, the display section 33, the communication section 34, and the image output section 35. Without any limitations to this, the electronic information device may include any of these sections.

As the electronic information device 30, an electronic information device that has an image input device is conceivable, such as a digital camera (e.g., digital video camera and digital still camera), an image input camera (e.g., a monitoring camera, a door phone camera, a camera equipped in a vehicle, and a television camera), a scanner, a facsimile machine and a camera-equipped cell phone device.

Therefore, according to Embodiment 3 of the present invention, the color image signal from the solid-state image capturing apparatus 31 can be: displayed on a display screen finely by the display section 33, printed out on a sheet of paper using an image output apparatus 35, communicated finely as communication data via a wire or a radio by the communication section 34; stored finely at the memory section 32 by performing predetermined data compression processing; and various data processes can be finely performed.

In Embodiments 1 and 2, it has been described that the P well layer 13 is provided on the N-type substrate 12 and the N layer of the light receiving section 1 is provided in the P well layer 13 in order to control crosstalk inside the substrate. Without limitation to this, an N well layer may be provided on a P-type substrate and a P layer of the light receiving section may be provided in the N well layer.

As described above, the present invention is exemplified by the use of its preferred Embodiments 1 to 3. However, the present invention should not be interpreted solely based on Embodiments 1 to 3 described above. It is understood that the scope of the present invention should be interpreted solely based on the claims. It is also understood that those skilled in the art can implement equivalent scope of technology, based on the description of the present invention and common knowledge from the description of the detailed preferred Embodiments 1 to 3 of the present invention. Furthermore, it is understood that any patent, any patent application and any references cited in the present specification should be incorporated by reference in the present specification in the same manner as the contents are specifically described therein.

Industrial Applicability

The present invention can be applied in the field of a solid-state image capturing device for performing photoelectric conversion on and capturing image light from a subject, which is composed of a semiconductor element, such as a MOS image sensor. Further, the present invention relates to an electronic information device, such as a digital camera (e.g., digital video camera and digital still camera), an image input camera, a scanner, a facsimile machine and a camera-equipped cell phone device, having the solid-state image capturing device as an image input device used in an image capturing section of the electronic information device. According to the present invention with the structure described above, a wiring layer within one layer positioned above a light receiving section, which functions as a photoelectric conversion section, is positioned at a regular distance in up direction and down direction as well as a left direction and a right direction, from the center of a unit pixel, the center of the light receiving region of the light receiving section, or a focusing point of light focused from a microlens, in a plan view, in such a manner that the wiring layer within one layer surrounds the light receiving region of the light receiving section so as to limit the incident light that enters the light receiving section. As a result, the area of the light receiving region of the light receiving section where obliquely-entering incident light enters becomes equal for each light receiving section that corresponds to a color filter of each color, thereby reducing the difference in brightness shading caused by obliquely-entering light and improving color balance (difference in color shading) between light receiving sections.

Further, the wiring layer within one layer is provided towards the center of a unit pixel, the center of the light receiving region of the light receiving section, or a focusing point of light focused from a microlens, than a position of a charge transfer electrode of a charge transfer transistor in a plan view, so that the difference in the light receiving region for incident light will be prevented among the light receiving sections due to attenuation of incident light by hitting the charge transfer electrode and/or the reflection of incident light from the charge transfer electrode, thereby improving the color balance among the light receiving sections.

Further, by equalizing the distances of the wiring layer within one layer in up and down directions (longitudinal direction) and left and right directions (transverse direction) from the center of the unit pixel or the focusing point of light focused by the microlens as described above, the incident light entering the microlens above the light receiving section is prevented from entering another light receiving section of a pixel adjacent to the light receiving section, thereby reducing a mixture of colors (crosstalk). In particular, a mixture of colors (crosstalk) to an adjacent pixel can be controlled by setting the position of the wiring layer within one layer inside the substrate such that red color light entering obliquely will not enter an adjacent light receiving section.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A solid-state image capturing device, comprising:
a multilayer wiring layer configured to provide an opening in a plurality of open regions above a plurality of respective light receiving sections utilized for performing photoelectric conversion on incident light to generate a signal charge;
a color filter of for each color of a plurality of colors provided above the multilayer wiring layer to correspond with each light receiving section; and
a microlens provided above each color filter, for focusing the incident light at each light receiving section,
wherein a wiring layer within at least one layer of the multilayer wiring layer is configured to limit an area of a light receiving region in which incident light enters each light receiving section, wherein the light is received equally among the light receiving sections.

2. The solid-state image capturing device according to claim 1, wherein the at least one wiring layer is positioned at a regular distance in an upwards direction and a downwards direction as well as a left direction and a right direction from a center of an unit pixel, the center of the light receiving region of the light receiving section, or a focusing point of light focused from the microlens above the light receiving section, in a plan view, to provide an opening for light to be received above the light receiving region.

3. The solid-state image capturing device according to claim 1, wherein the opening above the light receiving region, which is provided by at least one layer of the multilayer wiring layer, is positioned towards a side of the center of an unit pixel, the center of the light receiving region of the light receiving section, or a focusing point of light focused from a microlens at the light receiving section, in a plan view, than a charge transfer electrode for transferring a signal charge from the light receiving section to a charge detection section.

4. The solid-state image capturing device according to claim 2, wherein the opening above the light receiving region, which is opened by the wiring layer within one layer, is positioned towards the side of the center of an unit pixel, the center of the light receiving region of the light receiving section, or a focusing point of light focused from a microlens at the light receiving section, in a plan view, than a charge transfer electrode for transferring a signal charge from the light receiving section to a charge detection section.

5. The solid-state image capturing device according to claim 2, wherein a maximum size of each opening of the plurality of openings of the light receiving region is configured so that the charge transfer electrode does not appear in each opening above the light receiving region from the top in a plan view.

6. The solid-state image capturing device according to claim 3, wherein a maximum size of each opening of the plurality of openings of the light receiving region is configured so that the charge transfer electrode does not appear in each opening above the light receiving region from the top in a plan view.

7. The solid-state image capturing device according to claim 1, wherein the wiring layer within one layer is positioned in an oval shape having an equal distance in the up and down directions as well as in the left and right directions from the center of an unit pixel, the center of the light receiving region of the light receiving section, or the focusing point of light focused from the microlens, or in a polygon that is circumscribed on the oval shape, from the top, in such a manner to open the portion above the light receiving region.

8. The solid-state image capturing device according to claim 1, wherein the wiring layer within one layer is positioned in a circular shape having an equal distance in all the up, down, left and right directions from the center of an unit pixel, the center of the light receiving region of the light receiving section, or the focusing point of light focused from the microlens, or in a polygon that is circumscribed on the circle shape, from the top, in such a manner to open the portion above the light receiving region.

9. The solid-state image capturing device according to claim 1, wherein, in each opening above the light receiving region, an aspect ratio of a space in a longitudinal direction and a space in a transverse direction in the wiring layer within one layer is set to be similar to an aspect ratio of a pixel region that includes the plurality of light receiving sections.

10. The solid-state image capturing device according to claim 1, wherein the wiring layer within at least one layer is the bottom most wiring layer of the multilayer wiring layer, the bottom most wiring layer limiting light that enters the light receiving section.

11. The solid-state image capturing device according to claim 1, wherein the wiring layer is at least one wiring layer of the multilayer wiring layer, the at least one wiring layer limiting light that enters the light receiving section.

12. The solid-state image capturing device according to claim 1, wherein the wiring layer within at least one layer is provided intermittently or consecutively to form the opening to open the portion above the light receiving region.

13. The solid-state image capturing device according to claim 1, wherein a dummy layer, which is not used as a wiring to conduct electrical current, is included as the wiring layer within the at least one layer.

14. The solid-state image capturing device according to claim 12, wherein a dummy layer, which is not used as a wiring to conduct electrical current, is included as the wiring layer within at least one layer.

15. The solid-state image capturing device according to claim 1, wherein the opening to open the portion above the light receiving region is formed by detouring the wiring layer within at least one layer, cutting off the wiring layer within one layer, protruding the wiring layer within at least one layer with a predetermined width, and using a dummy layer which is not used as a wiring to conduct electrical current.

16. A solid-state image capturing device according to claim 12, wherein the opening to open the portion above the light receiving region is formed by detouring the wiring layer within at least one layer, cutting off the wiring layer within one layer, protruding the wiring layer within at least one layer with a predetermined width, and using a dummy layer which is not used as a wiring to conduct electrical current.

17. The solid-state image capturing device according to claim 1, wherein an opening having an area smaller than the light receiving region is opened as the opening to open the portion above the light receiving region, and an opening size of the opening is set such that a focusing spot from the microlens fits inside the opening.

18. The solid-state image capturing device according to claim 1, wherein a P well layer is provided in an N-type substrate and an N layer of the light receiving section is provided in the P well layer, or an N well layer is provided in a P-type substrate and a P layer of the light receiving section is provided in the N well layer.

19. The solid-state image capturing device according to claim 1, wherein the wiring layer within the at least one layer is positioned with an opening size of an opening set in such a manner that obliquely-entering incident light from a color filter adjacent to the color filter of each color will not enter a light receiving section corresponding to an adjacent color filter of a different color.

20. The solid-state image capturing device according to claim 18, wherein the wiring layer within one layer is positioned with an opening size of the opening set in such a manner that obliquely-entering incident light from a color filter adjacent to the color filter of each color will not enter a light receiving section corresponding to an adjacent color filter of a different color.

21. The solid-state image capturing device according to claim 19, wherein the incident light is red color light.

22. The solid-state image capturing device according to claim 20, wherein the incident light is red color light.

23. The solid-state image capturing device according to claim 1, wherein the wiring layer within one layer is formed of a metal material.

24. The solid-state image capturing device according to claim 1, wherein the solid-state image capturing device is a MOS image sensor having a charge detection section for converting a signal charge transferred from the plurality of light receiving sections into voltage, and a signal readout circuit for amplifying voltage converted in the charge detection section according to the converted voltage to be output as an image capturing signal.

25. The solid-state image capturing device according to claim 24, wherein elements that constitute the signal readout circuit are connected with one another by the multilayer wiring layer.

26. The solid-state image capturing device according to claim 24, having a multiple pixel sharing structure in which the plurality of light receiving sections share the charge detection section and the signal readout circuit.

27. The solid-state image capturing device according to claim 1, wherein, when the solid-state image capturing device has a multiple pixel sharing structure in which the plurality of light receiving sections share a charge detection section for converting a signal charge transferred from the light receiving section into voltage and a signal readout circuit for amplifying voltage converted by the charge detection section according to a required voltage to be output as an image capturing signal, a center of an unit pixel is defined to be the center of each divided region of a plurality of regions, in which an area occupied by the plurality of light receiving sections, the charge detection section, and the signal readout circuit, is divided by the number of the plurality of light receiving sections equally such that each one of the plurality of light receiving sections is included in each of the divided regions.

28. The solid-state image capturing device according to claim 2, wherein the light receiving region of the plurality of light receiving sections is either rectangular or square, and a charge transfer electrode is positioned across corner portions of the light receiving regions adjacently facing each other in an up and down direction.

29. The solid-state image capturing device according to claim 3, wherein the light receiving region of the light receiving section is either rectangular or square, and a charge transfer electrode is positioned across corner portions of the light receiving regions adjacently facing each other in an up and down direction.

30. The solid-state image capturing device according to claim 1, wherein the center of the unit pixel corresponds to the center of the light receiving region of the light receiving section, and the center of an unit pixel is arranged in such a manner to have the same pitch in up and down directions as well as left and right directions.

31. The solid-state image capturing device according to claim 27, wherein the center of the unit pixel corresponds to the center of the light receiving region of the light receiving section, and the center of an unit pixel is arranged in such a manner to have the same pitch in up and down directions as well as left and right directions.

32. The solid-state image capturing device according to claim 1, wherein the center of the unit pixel, the center of the light receiving region of the light receiving section, and a focusing point of light focused on the light receiving section by the microlens all correspond to one another, and the center of an unit pixel is arranged in such a manner to have the same pitch in up and down directions as well as left and right directions.

33. The solid-state image capturing device according to claim 27, wherein the center of an unit pixel, the center of the light receiving region of the light receiving section, and a focusing point of light focused on the light receiving section by the microlens all correspond to one another, and the center of the unit pixel is arranged in such a manner to have the same pitch in up and down directions as well as left and right directions.

34. An electronic information device comprising the solid-state image capturing device according to claim 1 as an image device in an image capturing section.

* * * * *